United States Patent [19]
Pfirsch

[11] Patent Number: 6,064,103
[45] Date of Patent: *May 16, 2000

[54] DEVICE WITH A P-N JUNCTION AND A MEANS OF REDUCING THE RISK OF BREAKDOWN OF THE JUNCTION

[75] Inventor: Frank Pfirsch, München, Germany

[73] Assignee: Siemens Aktiengesellschaft, Munich, Germany

[ * ] Notice: This patent is subject to a terminal disclaimer.

[21] Appl. No.: 09/043,640

[22] PCT Filed: Aug. 22, 1996

[86] PCT No.: PCT/DE96/01557

§ 371 Date: Mar. 20, 1998

§ 102(e) Date: Mar. 20, 1998

[87] PCT Pub. No.: WO97/11495

PCT Pub. Date: Mar. 27, 1997

[30]     Foreign Application Priority Data

Sep. 22, 1995 [DE] Germany ............................ 195 35 322

[51] Int. Cl.[7] .................................................. H01L 23/58
[52] U.S. Cl. ........................................ 257/488; 257/490
[58] Field of Search ...................................... 257/488, 490

[56]           References Cited

U.S. PATENT DOCUMENTS 4,605,948   8/1986   Martinelli .................................. 357/34

5,381,031   1/1995   Shibib ...................................... 257/488

FOREIGN PATENT DOCUMENTS 0 069 429 A2   12/1983   European Pat. Off. .

OTHER PUBLICATIONS

International Electron Devices Meeting, (1982) Technical Digest, San Francisco, CA, XP002022571, Nakagawa et al, A 1000 V High Voltage P–Channel DSAMOS–IC, pp. 72–75, Dec. 1982.

IEEE Transactions on Electron Devices, vol. 40, No. 10, (1993) J. Korec et al, Comparison of DMOS/IGBT—Compatible High–Voltage Termination Structures and Passivation Techniques, pp. 1845–1854, Oct. 1993.

Patent Abstracts of Japan, vol. 005, No. 176, (E–081), Nov. 12, 1981 & JP 56–103463 (Nippon Denso Co. Ltd.), Aug. 18, 1981.

*Primary Examiner*—Mark V. Prenty
*Attorney, Agent, or Firm*—Hill & Simpson

[57]            ABSTRACT

The arrangement with a pn-junction and the measure for reducing the risk of a breakdown of the junction is composed of a combination of a field plate (4) and a stop electrode respectively having a multi-step edge section (40 or, respectively, 50) with a JTE technique, as a result whereof blocking voltages clearly above 2500 Volts can be achieved given slight space requirement.

4 Claims, 4 Drawing Sheets

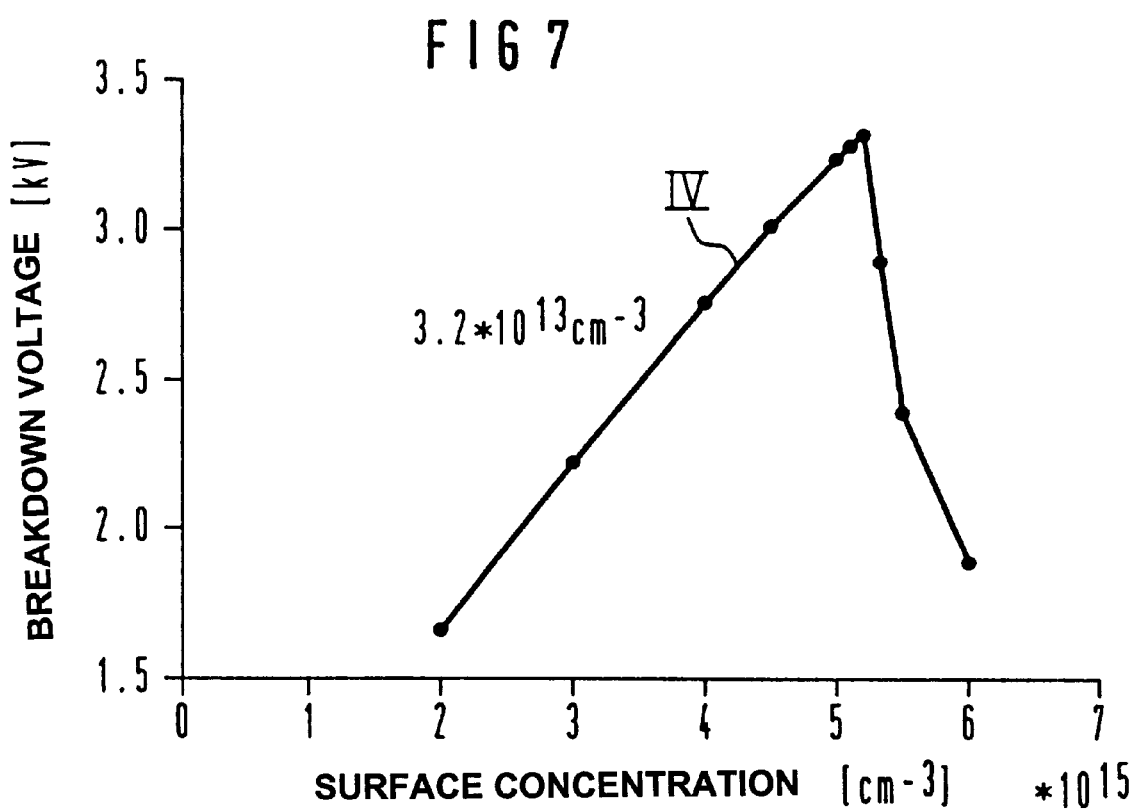

DEVICE WITH A P-N JUNCTION AND A MEANS OF REDUCING THE RISK OF BREAKDOWN OF THE JUNCTION

BACKGROUND OF THE INVENTION

The invention is directed to an arrangement with a junction from a p-doped zone to an n-doped zone according to the preamble of claim 1.

An arrangement of said species is known from Intern. Electron Devices Meeting, Techn. Digest, San Francisco, Calif., 13–15 December 1982, pages 72 through 75 and is suitable for blocking voltages of 1040 Volts.

In semiconductor components with a pn-junction for medium and high blocking voltages, it is necessary to undertake measures where the blocking pn-junction comes to the surface of the body of semiconductor material that reduce or entirely eliminate the risk of an electrical arc-over or of a breakdown of the pn-junction.

Given diodes, particularly power diodes, and bipolar transistors with isolated gate (IGBTs, IGBT standing for Isolated Gate Bipolar Transistor) for a blocking voltage of 1000 Volts, a measure according to IEEE Transactions on Electron Devices, Vol. 40, No. 10, pp. 1845 through 1854 (1993) for reducing the risk of an electrical arc-over or breakdown of the pn-junction formed in a body of semiconductor material, this pn-junction being a junction between a p-doped zone fashioned in this body at the surface thereof and an n-doped zone of the body adjoining this zone, is that on the surface of the body, an electrode is arranged in the region of the p-doped zone, said electrode having a multi-step edge section offset from the surface over a contour of this p-doped zone that limits the p-doped zone at the surface, and an electrode having a multi-step edge section is arranged outside the p-doped zone in the region of the n-doped zone, said multi-step edge section lying opposite and spaced from the edge section of the electrode arranged in the region of the p-doped zone and being offset from the surface.

The body of semiconductor material is composed, for example, of silicon and the electrodes are composed, for example, of aluminum or polysilicon.

The space required for this measure in the direction of the spacing between the edge regions of the electrodes amounts to approximately 350 $\mu$m.

The step heights in the multi-step edge regions are determined by the thickness of electrically insulating material, for example oxide layers, lying under the multi-step edge sections and between these sections and is limited to an overall thickness of about 10 $\mu$m for process-oriented reasons.

Each step of the multi-step edge section of the electrode arranged in the region of the p-doped zone generates an electrical field peak in the semiconductor material that is in turn blunted by the respectively following part of this electrode, so that this electrode can be interpreted as a field plate which is intended to effect that optimally no electrical field peaks occur in the body of semiconductor material.

The electrode arranged outside the p-doped zone in the region of the n-doped zone can be interpreted as a stop electrode that is intended to effect that a space charge zone does not spread farther in the body of semiconductor material.

The reduction of the blocking capability by the field peaks generated by the steps of the edge section field plate [sic] should be as slight as possible, which requires a good matching of the step height of every step measured perpendicular to the surface of the body and step length of every step measured parallel to this surface in the direction away from the p-doped zone. The field peak at a free end of the edge section of this electrode can no longer be reduced, as described, and therefore limits the maximally possible blocking capability of the body given a prescribed thickness of the layer of electrically insulating material, i.e. given a prescribed spacing of this free end from the surface.

Two field plate-protected field rings are therefore additionally introduced for components having a pn-junction for 1600 Volts blocking voltage, but these require much space, for example 650 $\mu$m. Such an arrangement becomes more and more unfavorable for even high blocking voltages.

Another proposed possibility of a measure for reducing the risk of an electrical arc-over or breakdown of a pn-junction is comprised of a junction extension technique (=JTE technique, JTE standing for Junction Termination Extension), whereby a p-doped zone more lightly doped compared to the p-doped zone is formed in the body at the surface thereof at the pn-junction formed in the body of semiconductor material, this pn-junction here also being a junction between a p-doped zone formed in the body at the surface thereof and an n-doped zone of the body adjoining this zone, said more lightly doped p-doped zone adjoining both the p-doped zone as well as the n-doped zone of the body.

When a blocking voltage is applied, the more lightly p-doped zone is partly but not entirely cleared of free charge carriers, whereby no greater field strength peaks occur.

The problem given this other measure is that a specific dose of the lighter p-doping must be very exactly observed in order to obtain a high blocking capability. Accordingly, the structure is very sensitive to surface charges and is technologically difficult to govern.

SUMMARY OF THE INVENTION

The invention recited is advantageously suited for blocking voltages of 1600 V and more given a low space requirement.

The inventive arrangement is advantageously suited for a voltage range from 1600 V to 2500 V, and blocking voltages of clearly above 2500 V can even be achieved given a slight space requirement of, for example, only 550 $\mu$m.

In a certain sense, the invention is composed of a novel combination of the two above-described, proposed measures and avoids their disadvantages.

The effect of the inventive combination is based on the following:

On the one hand, the more lightly p-doped zone reduces the field strength peaks, so that a higher blocking voltage can be achieved than without this more lightly p-doped zone given the same maximum spacing from the surface of the free end of the edge section of every electrode offset from the surface of the body of semiconductor material.

On the other hand, the exact dose of the lighter p-doping is less critical since charge lacking in the more lightly p-doped zone is made available to a certain extent by the electrode arranged in the region of the p-doped zone.

In general terms the present invention is an arrangement having a junction fashioned in a body of semiconductor material between a first p-doped zone formed in the body at the surface thereof and an n-doped zone of the body adjoining said zone.

A first electrode is arranged on the surface of the body in the region of the p-doped zone. The electrode has a multi-step edge section offset from the surface over a contour of the first p-doped zone that limits the first p-doped zone at the surface of the body. A second electrode has an at least single-step edge section outside the first p-doped zone in the region of the n-doped zone. The at least single-step edge section lying opposite and spaced from the edge section of the first electrode is arranged in the region of the p-doped zone and is offset from the surface. At least one more lightly p-doped zone, as compared to the first p-doped zone, is formed in the body at the surface thereof between the edge section of the first electrode arranged in the region of the first p-doped zone and the edge section of the second electrode arranged outside the first p-doped zone in the region of the n-doped zone. The junction is a pn-junction, whereby the n-doped zone adjoins the first p-doped zone. The more lightly p-doped zone adjoins the n-doped zone.

Advantageous developments of the present invention are as follows.

The more lightly p-doped zone is adjacent to the first p-doped zone under the edge section of the first electrode arranged in the region of the p-doped zone.

The more lightly p-doped zone extends continuously from the first p-doped zone in the direction toward the second electrode arranged outside the first p-doped zone in the region of the n-doped zone up to a point under the edge section of the second electrode.

The more lightly p-doped zone extends continuously from the first p-doped zone in the direction toward the second electrode arranged outside the first p-doped zone in the region of the n-doped zone up to a point under the edge section of the second electrode. The lightly p-doped zone has at least one interruption.

The more lightly p-doped zone has an interruption under the edge section of the first electrode arranged in the region of the first p-doped zone.

An interruption of the more lightly p-doped zone is located in the proximity of that end of the edge section of the first electrode arranged in the region of the first p-doped zone that faces away from the first electrode.

The second electrode arranged outside the first p-doped zone in the region of the n-doped zone is arranged in the region of a more highly n-doped zone as compared to the n-doped zone in the body at the surface thereof.

In particular, the arrangement having the interruption of the move lighty p-doped zone has the advantage that the region of the lighter p-dose in which the highest voltage is reached spreads.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 7 a diagram in which breakdown voltage of the arrangement of FIG. 6 is entered dependent on the concentration of the p-doping of the p-doped zone for a single n-doping of the body of semiconductor material.

DESCRIPTION OF THE PREFERRED EMBODIMENTS

Figure 1:
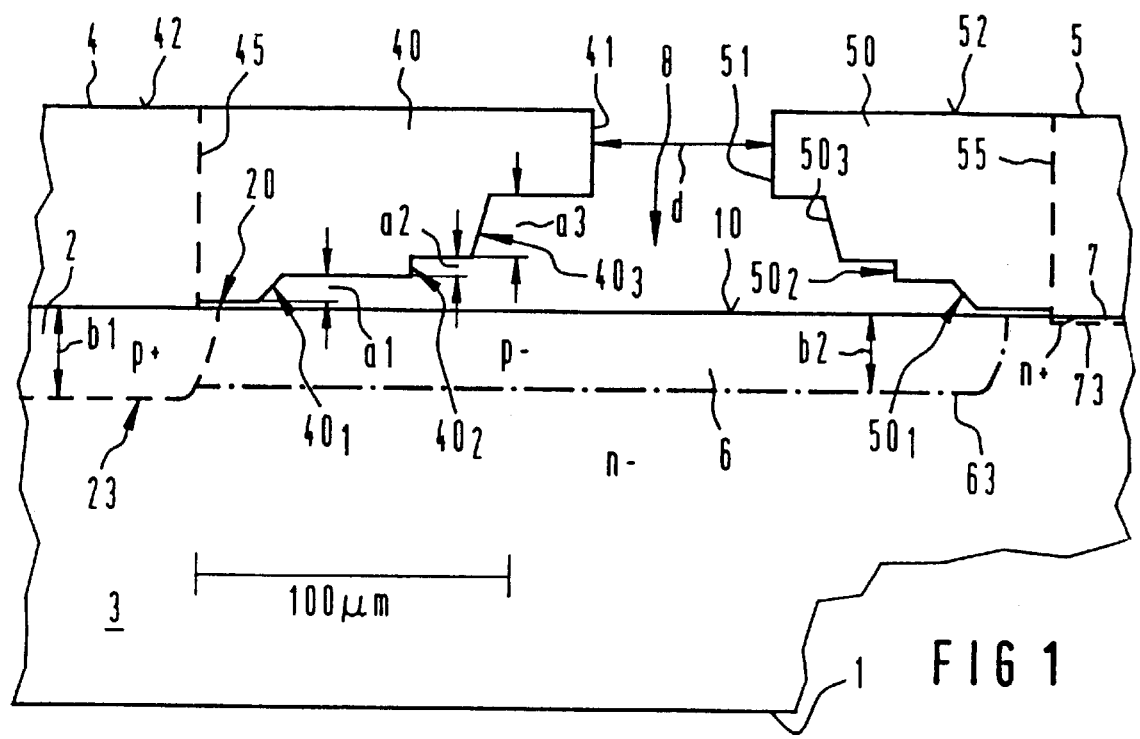
FIG. 1 a crossection through a first exemplary embodiment of the inventive arrangement.

In the exemplary embodiment according to FIG. 1 of the inventive arrangement, the body 1 of semiconductor material, for example silicon, comprises a pn-junction (referenced 23 and indicated by a broken line) that is a junction between a p-doped zone 2 fashioned in the body 1 at the surface 10 thereof and an n-doped zone 3 of the body 1 that is adjacent to this zone 2 and likewise at the surface 10.

The p-doped zone 2 preferably comprises a high doping concentration of $10^{17}$ through $10^{18}$ cm$^{-3}$ and is referred to below as p$^+$-doped zone for this reason. By contrast, the n-doped zone 3 preferably comprises a low doping concentration of $10^{13}$ through $10^{14}$ cm$^{-3}$ and is referred to below as n$^-$-doped zone for this reason.

At the surface 10 of the body 1, the p$^+$-doped zone 2 comprises a contour 20 that limits this zone 2 and simultaneously marks the pn-junction from the p$^+$-doped zone 2 to the n$^-$-doped zone 3 at the surface 10 of the body 1.

An electrode 4 is arranged on the surface 10 of the body 1 in the region of the p$^+$-doped zone 2, this electrode 4 comprises a multi-step edge section 40 over the contour 20 of the p$^+$-doped zone 2 offset from the surface 10 whose boundary with the electrode 4 is indicated by the broken line 45 perpendicular to the surface 10 of the body 1.

At its side facing toward the surface 10 of the body 1, the multi-step edge section 40 comprises several, for example three adjoining steps that are referenced $40_1$, $40_2$ and $40_3$ in sequence from left to right in FIG. 1, whereby the last step $40_3$ adjoins an end 41 of this edge section 40 that faces away from the electrode 4.

An electrode 5 is likewise arranged on the surface 10 of the body 1 but outside the p$^+$-doped zone 2 in the region of the n$^-$-doped zone 3, this electrode 5 comprising an at least one-step edge section 50 lying opposite the edge section 40 of the electrode 4 arranged in the region of the p$^+$-doped zone 2 at the distance d and being offset from the surface 10, the boundary of this edge section 50 with the electrode 5 being indicated by the broken line 55 perpendicular to the surface 10 of the body 1.

The edge section 50 can be structured simpler than the edge section 40; for manufacture-conditioned reasons, however, it is often expedient to likewise structure it multi-stepped, particularly essentially identical to the edge section 40.

In the example of FIG. 1, the edge section 50 is fashioned essentially the same as the edge section 40 and comprises three adjoining steps at its side allocated to the surface 10 of the body 1 that are referenced $50_1$, $50_2$ and $50_3$ in sequence from right to left in FIG. 1, whereby the last step $50_3$ is adjacent at an end 51 of this edge section 50 facing away from the electrode 5 and facing toward the end 41 of the edge section 40, this lying opposite the end 41 of the edge section 40 at the distance d.

Inventively, at least one more lightly p-doped zone 6 compared to the p⁺-doped zone 2 is formed in the body 1 at the surface 10 thereof between the edge section 40 of the electrode 4 and the edge section 50 of the electrode 5, this zone 6 adjoining the n⁻-doped zone 3, which is indicated by a dot-dash line 63.

The more lightly p-doped zone 6 preferably comprises a relatively low doping concentration of $10^{15}$ cm⁻³ through $10^{16}$ cm⁻³ and is referred to below as p⁻-doped zone for this reason.

The p⁻-doped zone 6 under the edge section 40 of the electrode 4 is preferably adjacent to the p⁺-doped zone 2 and, in the example of FIG. 1, extends continuously from the p⁺-doped zone 2 in the direction toward the electrode 5 up to a point under the edge section 50 of this electrode 5.

The steps $40_1$ through $40_3$ have the effect of respectively generating a field peak in the semiconductor material of the body 1, whereby each field peak generated by a step is in turn blunted by the part of the edge section 40 of the electrode 4 adjoining this step at the right in FIG. 1. The part of the edge section 40 adjoining the step $40_1$ at the left has the job of blunting the field peaks occurring at the right-hand edge of the p⁺-doped zone 2.

The electrode 5 has the job of stopping the spread of a space charge zone in the body 1 toward the right in FIG. 1 and can therefore also be referred to as stop electrode. For this job, it is beneficial when electrode 5 is arranged in the region of a more highly doped zone 7 in the body 1 compared to the n⁻-doped zone 3, this zone 7 adjoining the surface 10 thereof and its boundary with the n⁻-doped zone 3 being indicated by a dotted line 73 in FIG. 1. The doping concentration of the more highly n-doped zone 7 is preferably higher than $10^{18}$ cm⁻³ and can therefore be referred to as n⁺-doped zone.

The electrodes 4 and 5 and their steps $40_1$ through $40_3$ or, respectively, $50_1$ through $50_3$ are expediently generated with the assistance of a stepped coating of an electrically insulating material, for example oxide, that is generated partially on the surface 10 of the body 1 and defines the steps of the electrodes 4 and 5, whereby the electrodes 4 and 5 are produced by application of one or more layers of electrically conductive material onto the surface 10 of the body 1 and onto the stepped coating. Such a stepped coating fills up the space 8 between the electrodes 4 and 5.

That surface 42 or, respectively, 52 of the electrodes 4 and 5 facing away from the surface 10 of the body 1 is not flat given the indicated manufacture, as shown in FIG. 1, but likewise comprises steps that approximately follow the illustrated steps.

It is expedient—and not only given this manufacture—when the step height of the steps of the two electrodes 4 and 5 lying at the same level relative to the surface 10 are [sic] the same measured perpendicular to the surface 10 of the body 1. According to FIG. 1, for example, the steps $40_1$ and $50_1$ have the same step height a1, the steps $40_2$ and $50_2$ have the same step height a2 and the steps $40_3$ and $50_3$ have the same step height a3. The horizontally measured lengths of the individual steps in FIG. 1 can differ from one another, particularly comparing the two electrodes 4 and 5 to one another.

The critical p⁻-doped zone 6 extending beyond the end 41 of the electrode 4 in the direction to the electrode 5 advantageously reduces the field strength peaks, so that, given the same maximum spacing of the end 41 of the edge section 40 of the electrode 4 from the surface 10 of the body 1, a higher blocking voltage can be achieved than without this p⁻-doped zone 6; on the other hand, the exact doping concentration of the p⁻-doping is advantageously less critical since lacking charge in the p⁻-doped zone 6 is made available up to a certain extent by the electrode 4 arranged in the region of the p⁺-doped zone 2.

Figure 2:
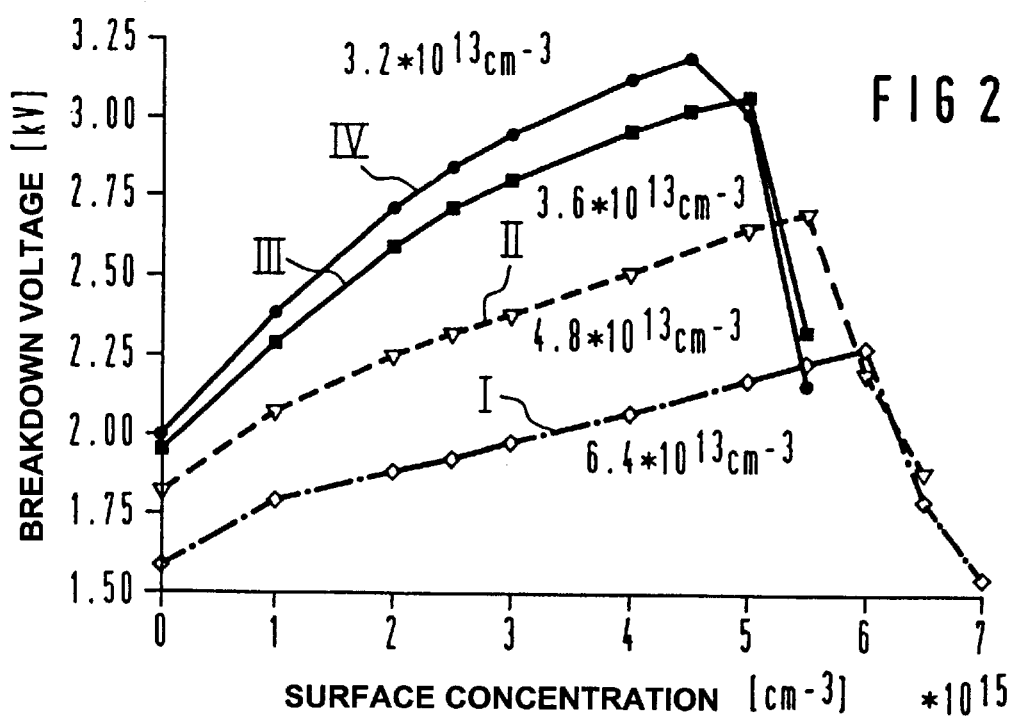
FIG. 2 a diagram in which breakdown voltage [sic] of the example of FIG. 1 are entered dependent on the concentration of the p-doping of the p-doped zone for various n-dopings of the body of semiconductor material.

The breakdown voltages of the pn-junction 23 for various doping concentrations of the n⁻-doping of the body 1 of semiconductor material dependent on various doping concentrations of the n⁻-doped zone 3 can be derived from the diagram shown in FIG. 2. It is thereby assumed that the body 1 is composed of silicon, the doping concentration of the p⁺-doped zone 2 is equal to $10^{17}$ cm⁻³ through $10^{18}$ cm⁻³ and the vertical thickness b1 thereof in FIG. 1 typically amounts to about 6 μm, the doping concentration of the n⁻-doped zone 3 lies in the range from $3 \cdot 10^{13}$ through $7 \cdot 10^{13}$ cm⁻³, the doping concentration of the p⁻-doped zone 6 at the surface 10 of the body 1 lies in the range from $10^{15}$ cm⁻³ through $7 \cdot 10^{15}$ cm⁻³ and the vertical thickness b2 thereof in FIG. 1 typically amounts to about 6 μm, the two electrodes 4 and 5 are composed of polysilicon and/or metal with a typical thickness of 15 μm, the step height a1 is equal to 2 μm, the step height a2 is equal to 1.5 μm and the step height a3 is equal to 4.8 μm, and the horizontal dimension of the overall arrangement in FIG. 1 is approximately equal to 550 μm.

In sequence, the curves I through IV in FIG. 2 respectively indicate the curve of the breakdown voltage of the pn-junction 23 dependent on the doping concentration of the p⁻-doped zone 6 at the surface 10 of the body 1 for the specific doping concentrations $6.4 \cdot 10^{13}$ cm⁻³, $4.8 \cdot 10^{13}$ cm⁻³, $3.6 \cdot 10^{13}$ cm⁻³ or, respectively, $3.2 \cdot 10^{13}$ cm⁻³ of the n⁻-doped zone 3. The curves respectively exhibit a relatively broad maximum, which sees to it that the range of the doping concentration at the surface 10 of the p-doped zone 6 in which the highest breakdown voltage is achieved is relatively broad and it is thus not a matter of an exact doping concentration of this zone 6. The maximum of the curve IV also shows that a maximum breakdown voltage of approximately 3.25 kV can be achieved given the horizontal dimension of 550 μm for the overall arrangement.

Figure 3:
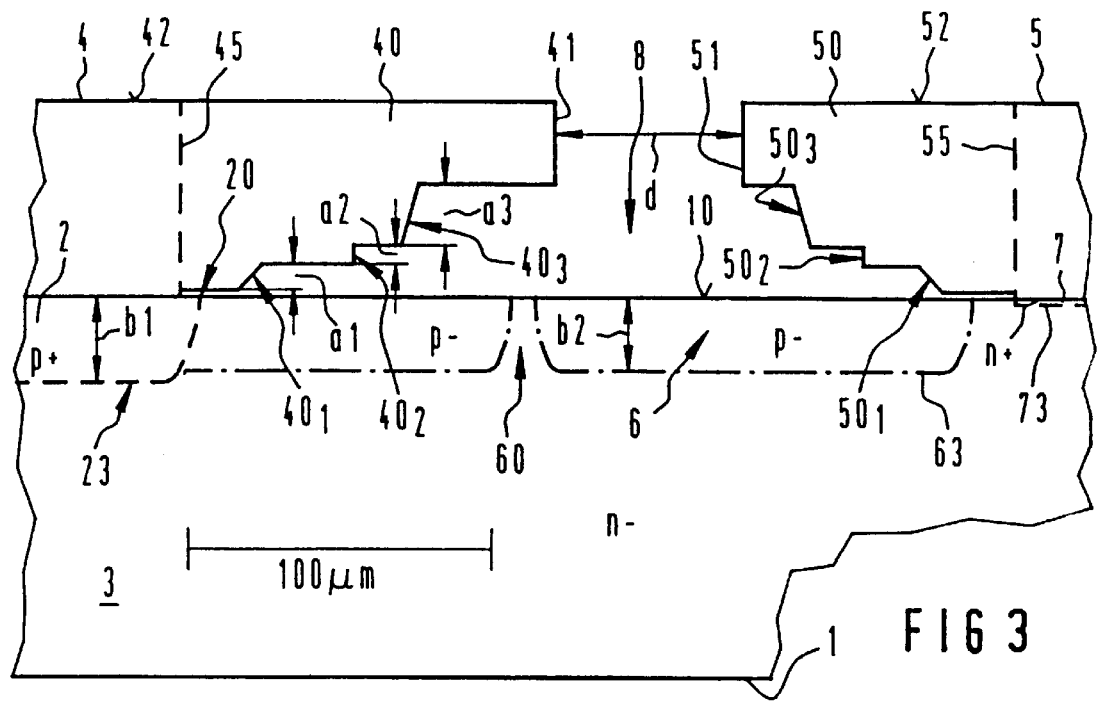
FIG. 3 a crossection through a second exemplary embodiment of the inventive arrangement, whereby the more lightly p-doped zone comprises an interruption.

The exemplary embodiment of FIG. 3 differs from the exemplary embodiment of FIG. 1 only in that the p⁻-doped zone 6 extending from the p⁺-doped zone 2 in the direction toward the electrode 5 up to a point under the edge section 50 of this electrode 5 comprises at least one interruption. Otherwise, this exemplary embodiment is identical to the example of FIG. 1.

In the example of FIG. 3, the p⁻-doped zone 6 preferably comprises an interruption 60 under the edge section 40 of the electrode 4 and/or in the proximity of the end 41 of the edge region 40 of this electrode 4. An interruption 60 under the end 41 advantageously leads thereto that the range of the doping concentration of the p⁻-doped zone 6 at the surface 10 in which the highest breakdown voltage is achieved becomes broader compared to the comparison example of FIG. 1.

Figure 4:
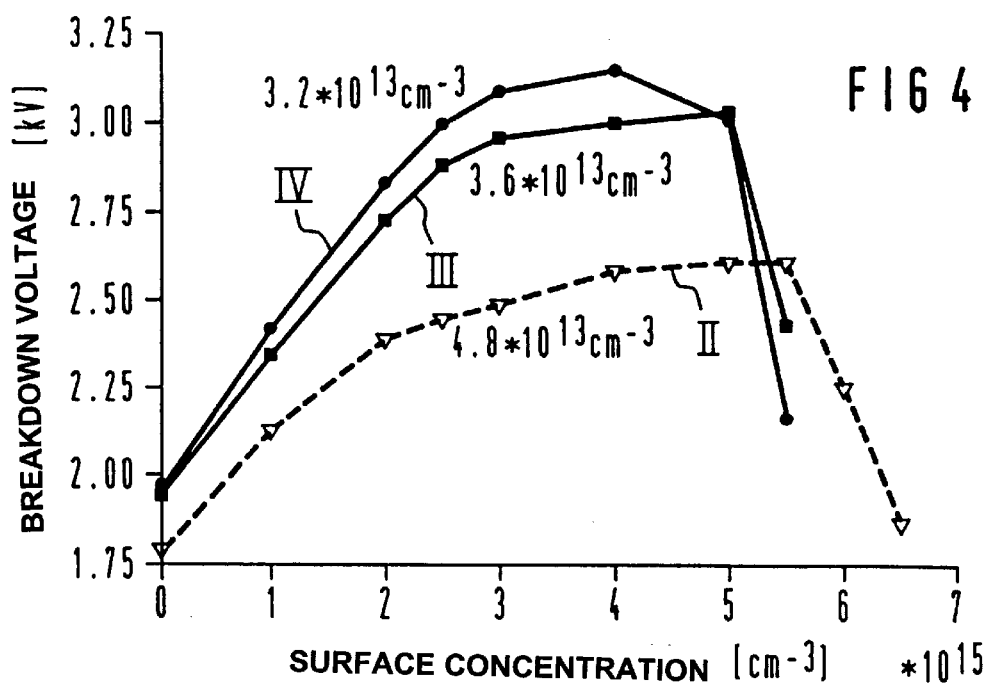
FIG. 4 a diagram in which breakdown voltages of the example of FIG. 3 are entered dependent on the concentration of the p-doping of the p-doped zone for various n-dopings of the body of semiconductor material.

The latter can be seen from the diagram of FIG. 4, in which the curve of the breakdown voltages of the pn-junction 23 for the doping concentrations $4.8 \cdot 10^{13}$ cm⁻³, $3.6 \cdot 10^{13}$ cm⁻³ and $3.2 \cdot 10^{13}$ cm⁻³ of the n⁻-doped zone 3 are entered in curves II, III or, respectively, IV dependent on various doping concentrations of the n⁻-doped zone 3, whereby the same conditions as in FIG. 2 otherwise form the basis. Compared to the corresponding curves II, III or, respectively, IV in FIG. 2, these curves show a clearly broader maximum. The maximum of the curve IV in FIG. 4 likewise shows that a maximum breakdown voltage of approximately 3.25 kV can be achieved given the horizontal dimension of 550 μm for the overall arrangement.

Figure 5:
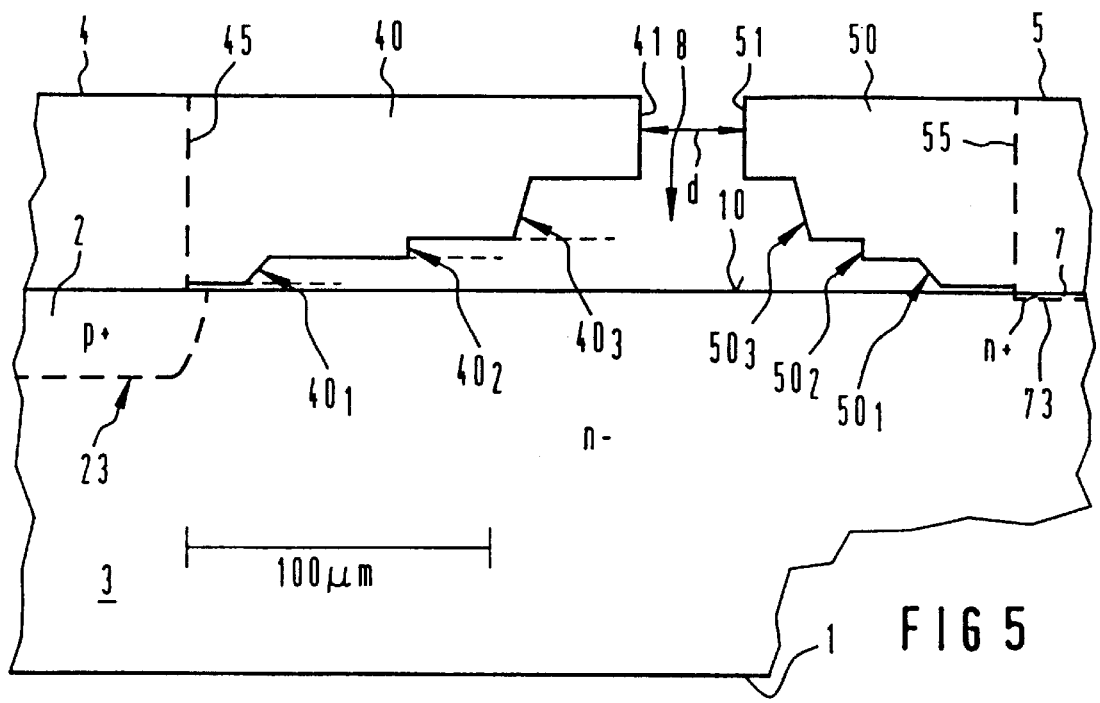
FIG. 5 a proposed arrangement with two electrodes, shown in crossection.

By way of example, FIG. 5 shows a traditional arrangement with two electrodes 4 and 5 that only differs from the inventive arrangement of FIG. 1 or 3 in that it lacks the p⁻-doped zone 6 but is otherwise the same.

Figure 6:
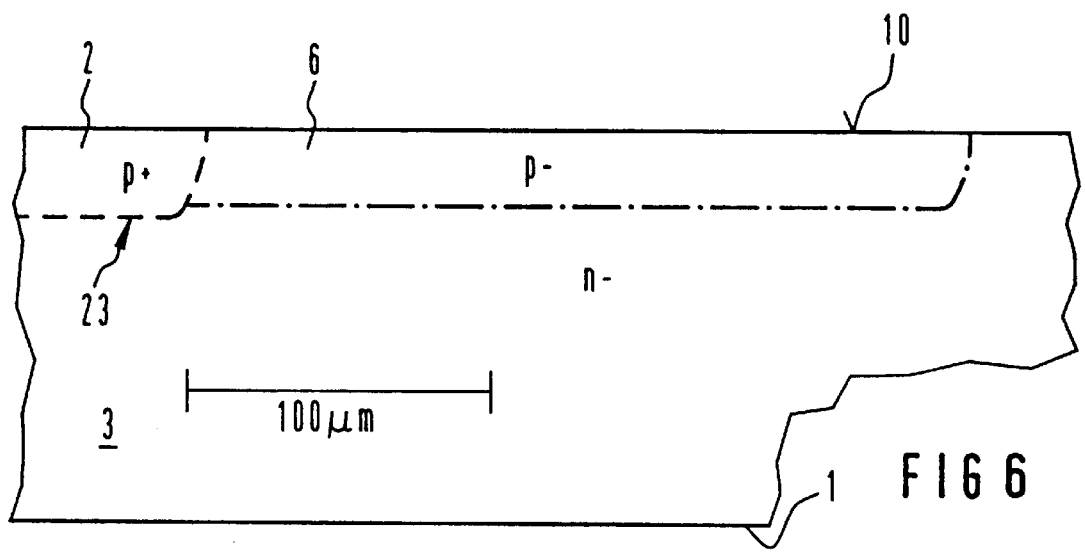
FIG. 6 another proposed arrangement in JTE technique, shown in crossection.

By way of example, FIG. 6 shows a traditional arrangement in JTE technique with a p⁻-doped zone 6 that differs from the inventive arrangement of FIGS. 1 or 3 only in that it lacks the electrodes 4 and 5 but is otherwise the same.

In the curve IV, the diagram of FIG. 7 shows the curve of the breakdown voltage of the pn-junction 23 of the traditional arrangement according to FIG. 6 for the doping concentration $3.2 \cdot 10^{13}$ cm$^{-3}$ of the n⁻-doped zone 3 dependent on the doping concentration of the p⁻-doped zone 6 at the surface 10 of the body 1, whereby the horizontal dimension of the overall traditional arrangement again amounts to 550 μm. The maximum of this curve lying above 3 kV can be clearly seen, but this is very pointed and narrow compared to the corresponding curves IV in FIG. 2 and FIG. 4, so that the range of the doping concentration of the p⁻-doped zone 6 at the surface 10 in which the highest breakdown voltage is achieved is unbeneficially very narrow.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An arrangement, comprising:

a junction in a body of semiconductor material between a first p-doped zone in the body at a surface thereof and an n-doped zone in the body adjoining said p-doped zone;

a first electrode on the surface of the body in a region of the first p-doped zone, said first electrode having a multi-step edge section offset from the surface of the body over a contour of the first p-doped zone that limits the first p-doped zone at the surface of the body;

a second electrode having an at least single-step edge section outside the first p-doped zone in a region of the n-doped zone, said at least single-step edge section lying opposite and spaced from the edge section of the first electrode in the region of the first p-doped zone and being offset from the surface;

at least one lightly p-doped zone as compared to doping of the first p-doped zone, the lightly p-doped zone being in the body at the surface thereof between the edge section of the first electrode arranged in the region of the first p-doped zone and the edge section of the second electrode arranged outside the first p-doped zone in the region of the n-doped zone;

the junction being a pn-junction, wherein the n-doped zone adjoins the first p-doped zone; and the more lightly p-doped zone adjoins the n-doped zone;

wherein the more lightly p-doped zone is adjacent to the first p-doped zone under the edge section of the first electrode arranged in the region of the first p-doped zone; and wherein the more lightly p-doped zone extends continuously from the first p-doped zone in the direction toward the second electrode arranged outside the first p-doped zone in the region of the n-doped zone up to a point under the edge section of the second electrode, and the lightly p-doped zone has at least one interruption.

2. The arrangement according to claim 1, wherein the more lightly p-doped zone has an interruption under the edge section of the first electrode arranged in the region of the first p-doped zone.

3. The arrangement according to claim 1, wherein an interruption of the more lightly p-doped zone is located in a proximity of an end of the edge section of the electrode arranged in the region of the first p-doped zone that faces away from the first electrode.

4. The arrangement according to claim 1, wherein the second electrode arranged outside the first p-doped zone in the region of the n-doped zone is arranged in a region of a more highly n-doped zone as compared to doping of the n-doped zone in the body at the surface thereof.

* * * * *